(12) United States Patent
Zhang et al.

(10) Patent No.: US 12,500,577 B2
(45) Date of Patent: Dec. 16, 2025

(54) DUPLEXER, NETWORK DEVICE, CONTROL METHOD, ELECTRONIC DEVICE, AND STORAGE MEDIUM

(71) Applicant: ZTE CORPORATION, Shenzhen (CN)

(72) Inventors: Zhen Zhang, Shenzhen (CN); Zhuo Li, Shenzhen (CN); Juan Gu, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 337 days.

(21) Appl. No.: 18/006,780

(22) PCT Filed: Jul. 6, 2021

(86) PCT No.: PCT/CN2021/104788
§ 371 (c)(1),
(2) Date: Jan. 25, 2023

(87) PCT Pub. No.: WO2022/037294
PCT Pub. Date: Feb. 24, 2022

(65) Prior Publication Data
US 2023/0261643 A1  Aug. 17, 2023

(30) Foreign Application Priority Data

Aug. 17, 2020  (CN) .......................... 202010827160.9

(51) Int. Cl.
*H03H 11/34*  (2006.01)
*H01P 1/207*  (2006.01)

(52) U.S. Cl.
CPC ........... *H03H 11/344* (2013.01); *H01P 1/207* (2013.01)

(58) Field of Classification Search
CPC ...... H03H 11/344; H01P 1/207; H01P 1/2138
USPC ................ 333/17.1, 203, 224, 231–233, 235
See application file for complete search history.

(56) References Cited

U.S. PATENT DOCUMENTS

| | | |
|---|---|---|
| 2006/0152302 A1 | 7/2006 | Hirose et al. |
| 2007/0296529 A1 | 12/2007 | Zhang et al. |
| 2016/0315368 A1 | 10/2016 | Liang et al. |

FOREIGN PATENT DOCUMENTS

| | | |
|---|---|---|
| CN | 201038289 Y | 3/2008 |
| CN | 201466178 U | 5/2010 |
| CN | 107910624 A | 4/2018 |
| CN | 110825168 A | 2/2020 |
| CN | 111243481 A | 6/2020 |
| CN | 111370824 A | 7/2020 |
| JP | H034703 U | 1/1991 |

(Continued)

OTHER PUBLICATIONS

Machine English Translation of CN111243481A Published on Jun. 5, 2020 (Year: 2020).*

(Continued)

*Primary Examiner* — Jorge L Salazar, Jr.
(74) *Attorney, Agent, or Firm* — Vivacqua Crane, PLLC (57) ABSTRACT

Disclosed are a duplexer, a network device, a control method, an electronic device and a storage medium. The duplexer may include: a filter, a dielectric tuning component; and a control module connected with the dielectric tuning component and configured to control a relative position between the dielectric tuning component and the filter to adjust an operating frequency of the duplexer.

11 Claims, 8 Drawing Sheets

(56) References Cited

FOREIGN PATENT DOCUMENTS

| | | | |
|---|---|---|---|
| JP | 2002217606 | A | 8/2002 |
| JP | 2002299909 | A | 10/2002 |
| JP | 2004129146 | A | 4/2004 |
| JP | 2009542096 | A | 11/2009 |
| KR | 20020068934 | A | 8/2002 |
| KR | 20130011044 | A | 1/2013 |
| KR | 20130116780 | A | 10/2013 |
| KR | 101387646 | B1 | 4/2014 |
| KR | 20190015959 | A | 2/2019 |
| WO | 2004079857 | A1 | 9/2004 |

OTHER PUBLICATIONS

Machine English Translation of KR20190015959A Published on Feb. 15, 2019 (Year: 2019).*

Japan Patent Office. Notice of Reasons for Refusal for JP Application No. 2023-505785 and English translation, mailed Dec. 5, 2020, pp. 1-12.

International Searching Authority. International Search Report and Written Opinion for PCT Application No. PCT/CN2021/104788 and English translation, mailed Oct. 9, 2021, pp. 1-11.

European Patent Office. Extended European Search Report for EP Application No. 21857389.7, mailed Dec. 4, 2023, pp. 1-8.

* cited by examiner

DUPLEXER, NETWORK DEVICE, CONTROL METHOD, ELECTRONIC DEVICE, AND STORAGE MEDIUM

CROSS-REFERENCE TO RELATED APPLICATION

This application is a national stage filing under 35 U.S.C. § 371 of international application number PCT/CN2021/104788, filed Jul. 6, 2021, which claims priority to Chinese patent application No. 202010827160.9, filed Aug. 17, 2020. The contents of these applications are incorporated herein by reference in their entirety.

TECHNICAL FIELD

The present disclosure relates to the technical field of communication, and in particular to a duplexer, a network device, a control method, an electronic device and a storage medium.

BACKGROUND

An existing Out Door Unit (ODU) product adopts a duplex design. The existing duplexer has the disadvantages of generally non-adjustable operating frequency, poor flexibility, and narrow application range. For example, a device manufacturer delivers goods according to the frequency bands required by operator's duplexers, but each frequency band (for example, 23 G is from 21.2 G to 23.6 G) is divided into several sub-bands, in order to deliver goods in time, the manufacturer needs to prepare a certain stock of duplexer spare parts for different sub-bands, which is easy to cause backlog of goods.

SUMMARY

Embodiments of the present disclosure provide a duplexer, a network device, a control method, an electronic device and a storage medium.

In view of the above, an embodiment of the present disclosure provides a duplexer. The duplexer may include: a filter; a dielectric tuning component; and a control module connected with the dielectric tuning component and configured to control a relative position between the dielectric tuning component and the filter to adjust an operating frequency of the duplexer.

An embodiment of the present disclosure further provides a network device. The network device may include: the foregoing duplexer; and a main control module connected with the duplexer and configured to send a control signal to the duplexer to adjust an operating frequency of the duplexer.

An embodiment of the present disclosure further provides a duplexer control method. The duplex may include a filter and a dielectric tuning component. The method may include: acquiring a control signal; and outputting a driving signal according to the control signal to control a relative position between the dielectric tuning component and the filter.

An embodiment of the present disclosure further provides an electronic device. The electronic device may include: a memory, a processor, and a computer program stored in the memory and executable by the processor which, when executed by the processor, causes the processor to implement the foregoing method.

An embodiment of the present disclosure further provides a storage medium configured for computer-readable storage, the storage medium stores at least one program executable by at least one processor which, executed by the at least one processor, causes the at least one processor to implement the foregoing method.

Other features and advantages of the present disclosure will be set forth in the following description, and partly become obvious from the description, or understood by implementing the present disclosure. The objects and other advantages of the present disclosure can be realized and obtained by the structure particularly pointed out in the description, claims, and drawings.

REFERENCE NUMERALS

Filter 100, Dielectric Tuning Component 200, Control Module 300, Processing Unit 310, Driving Unit 320, Motor Unit 330, Lifting Component 331, Transmission Component 332, Gear 3321, Threaded Shaft 3322, Motor 333, Limiting component 334, Hall Sensor 335, Storage Unit 340, Housing 400, Gear Box 410, Lifting Plate 420, Limiting Post 421, Limiting pin 422, Duplexer 500, Main Control Module 600.

DETAILED DESCRIPTION

In order to make the objects, technical schemes and advantages of the present disclosure clear, the present disclosure will be further described in detail in conjunction with the drawings and embodiments. It should be understood that some embodiments described here are only used to illustrate the present disclosure, and are not used to limit the present disclosure. The embodiments in the present disclosure and the features in the embodiments may be combined with each other at random if not in collision.

In the following description, a suffix such as "module", "component" or "unit" used to represent elements is merely intended to facilitate description of the present disclosure, and the suffix is not intended to give any special meaning. Therefore, "module", "component", or "unit" can be used interchangeably.

It is to be noted, although functional modules have been divided in the schematic diagrams of apparatuses and logical orders have been shown in the flowcharts, in some cases, the modules may be divided in a different manner, or the steps shown or described may be executed in an order different from the orders as shown in the flowcharts. The terms such as "first", "second" and the like in the description, the claims, and the accompanying drawings are used to distinguish similar objects, and are not necessarily used to describe a specific sequence or a precedence order.

A duplexer is a main accessory applied in an inter-frequency duplex radio station and a repeater station and functions to isolate transmitted and received signals to ensure that the receiver and transmitter can operate normally at the same time. The duplexer is composed of two groups of band-pass filters with different frequencies, to prevent its transmitted signal from being transmitted to the receiver.

An existing Out Door Unit (ODU) product adopts a duplexer design. The duplexer is communicatively connected with a Central Processing Unit (CPU) of the ODU. The existing duplexer has the disadvantages of generally non-adjustable operating frequency, poor flexibility, and narrow application range. For example, a device manufacturer delivers goods according to the frequency bands required by operator's duplexers, but each frequency band (for example, 23 G is from 21.2 G to 23.6 G) is divided into several sub-bands, in order to deliver goods in time, the manufacturer needs to prepare a certain stock of duplexer spare parts for different sub-bands, which is easy to cause backlog of goods. In order to achieve the purpose of covering a frequency band with one hardware stock to reduce the stock of spare parts, it is necessary to develop a frequency-adjustable duplexer, which can adjust the operating frequency of the duplexer according to the field frequency requirements without replacing hardware.

In view of the above, embodiments of the present disclosure provide a duplexer, a network device, a control method, an electronic device and a storage medium, which can achieve the purpose of adjusting an operating frequency of the duplexer, thereby improving the flexibility and application range of the duplexer, and reducing the stock pressure of the manufacturer.

The technical schemes of the present disclosure will be elaborated below in conjunction with embodiments.

Figure 1:
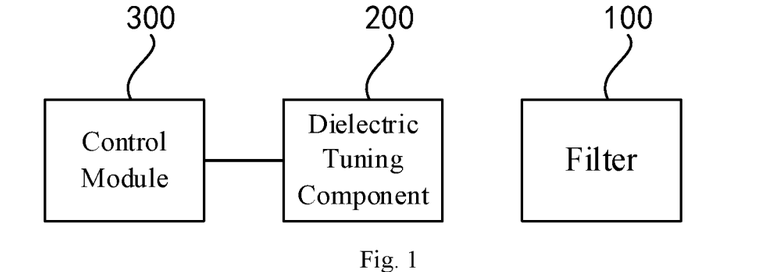
FIG. 1 is a schematic structural diagram of a duplexer provided by an embodiment of the present disclosure.

In accordance with an aspect of the present disclosure, as shown in FIG. 1, an embodiment provides a duplexer. The duplexer includes:
 a filter 100;
 a dielectric tuning component 200; and
 a control module 300 connected with the dielectric tuning component 200 and configured to control a relative position between the dielectric tuning component 200 and the filter 100 to adjust an operating frequency of the duplexer.

In some embodiments, the relative position between the dielectric tuning component and the filter (an internal metal diaphragm) of the duplexer is one of the important factors that determine the electrical performance (e.g., operating frequency) of the duplexer. The control module of the duplexer can control the relative position between the dielectric tuning component and the filter, to achieve the purpose of adjusting the operating frequency of the duplexer. When a duplexer with multiple frequencies is needed, the operating frequency of the duplexer can be adjusted by adjusting the relative position between the dielectric tuning component and the filter, which improves the flexibility and application range of the duplexer, thus avoiding the problem that a certain stock of duplexer spare parts needs to be prepared for different sub-bands, and reducing the stock pressure of the manufacturer.

In some embodiments, the dielectric tuning component 200 is a dielectric tuning rod.

Figure 2:
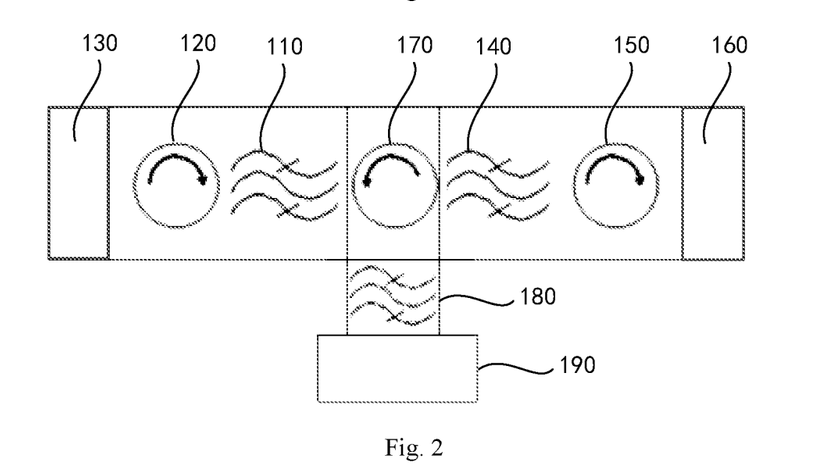
FIG. 2 is a schematic structural diagram of a filter provided by an embodiment of the present disclosure.

In some embodiments, as shown in FIG. 2, the filter 100 includes a transmitting filter 110, a transmitting isolator 120, a transmitting waveguide port 130, a receiving filter 140, a receiving isolator 150, a receiving waveguide port 160, a circulator 170, a low-pass filter 180 and an antenna waveguide port 190. The transmitting isolator 120 and the receiving isolator 150 function to isolate and filter signals. The circulator 170 is a three-port device, and the signals passing through the circulator are transmitted in a direction indicated by an arrow of the circulator.

In some embodiments, a radio-frequency signal from the CPU of the ODU enters the filter 100 from the transmitting waveguide port 130, passes through the transmitting isolator 120 (transmitted in a direction indicated by the arrow), the transmitting filter 110, the circulator 170, the low-pass filter 180, and reaches the antenna waveguide port 190; and a radio-frequency signal from the antenna waveguide port 190 passes through the low-pass filter 180, the circulator 170, the receiving filter 140 and the receiving isolator 150 (transmitted in a direction indicated by the arrow), reaches the receiving waveguide port 160, and enters the CPU of the ODU, thus realizing the band-pass filtering of the transmitted signal and the received signal.

In some embodiments, the control module 300 may adopt a Tunable Filter Controlled Board (TFCB). TFCB may be directly assembled on the duplexer as an independent module, communicate with the CPU of the ODU through a 12-pin interface line, and receive a control signal from the CPU.

Figure 3:
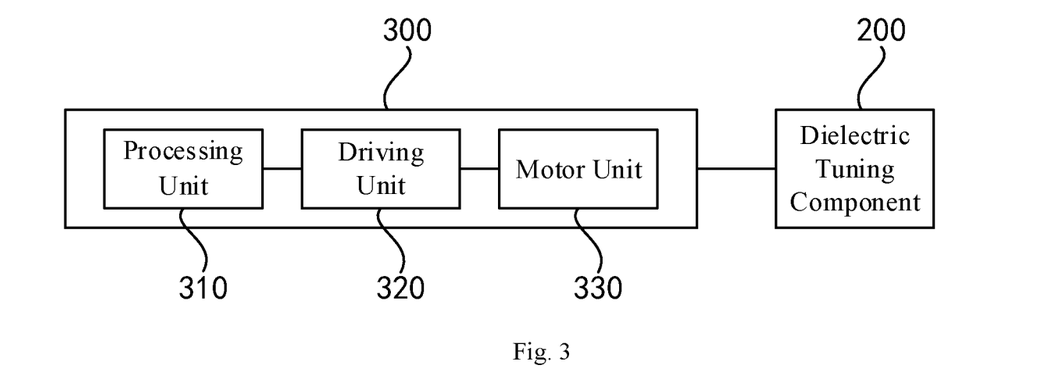
FIG. 3 is a schematic structural diagram of a duplexer provided by another embodiment of the present disclosure.

In some embodiments, as shown in FIG. 3, the control module 300 includes: a processing unit 310, a driving unit 320 and a motor unit 330.

The processing unit 310 is configured to acquire a control signal and output a driving signal according to the control signal.

The driving unit 320 is connected with the processing unit 310, and configured to receive the driving signal and drive a motor unit according to the driving signal.

The motor unit 330 is connected with the driving unit 320 and the dielectric tuning component 200 respectively, and configured to control the relative position between the dielectric tuning component 200 and the filter 100.

In some embodiments, the control module 300 includes a processing unit 310, a driving unit 320 and a motor unit 330 which are connected in sequence. The processing unit 310 acquires a control signal from the CPU and outputs a driving signal to the driving unit 320 according to the control signal. The driving unit 320 drives the motor unit 330 according to the driving signal. The motor unit 330 drives the dielectric tuning component 200 to be displaced, so that the relative position between the dielectric tuning component 200 and the filter 100 changes, thereby adjusting the operating frequency of the duplexer.

In some embodiments, the processing unit 310 may adopt a processor or controller (such as a Programmable logic Controller (PLC), a Proportion Integration Differentiation (PID) controller, or the like). The driving unit 320 may adopt a motor driving chip.

Figure 4:
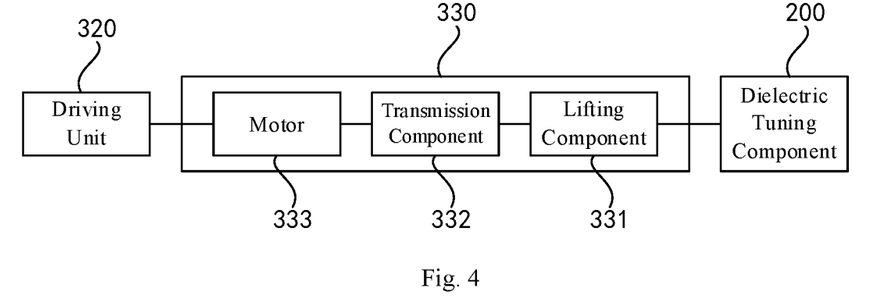
FIG. 4 is a schematic structural diagram of a duplexer provided by another embodiment of the present disclosure.

In some embodiments, as shown in FIG. 4, the motor unit 330 includes: a lifting component 331, a transmission component 332 and a motor 333.

The lifting component 331 is connected with the dielectric tuning component 200.

The transmission component 332 is connected with the lifting component 331, and configured to control the displacement of the lifting component 331, so as to control the relative position between the dielectric tuning component 200 and the filter 100.

The motor 333 is connected with the driving unit 320 and the transmission component 332, respectively and configured to drive the transmission component 332.

In some embodiments, the motor unit 330 includes a motor 333, a transmission component 332 and a lifting component 331 which are connected in sequence. The driving unit 320 drives the motor 333, the motor 333 drives the transmission component 332 to rotate, and the transmission component 332 drives the lifting component 331 to ascend or descend. The lifting component 331 is fixedly connected with the dielectric tuning component 200 and thus drives the dielectric tuning component 200 to be displaced, to change the relative position between the dielectric tuning component 200 and the filter 100, thereby adjusting the operating frequency of the duplexer.

In some embodiments, the lifting component 331 may adopt a lifting plate. The lifting plate has a through hole, through which the dielectric tuning component 200 is fixedly connected with the lifting plate. The lifting plate ascends or descends to drive the dielectric tuning component 200 to be displaced, to change the relative position between the dielectric tuning component 200 and the filter 100, thereby adjusting the operating frequency of the duplexer.

Figure 5:
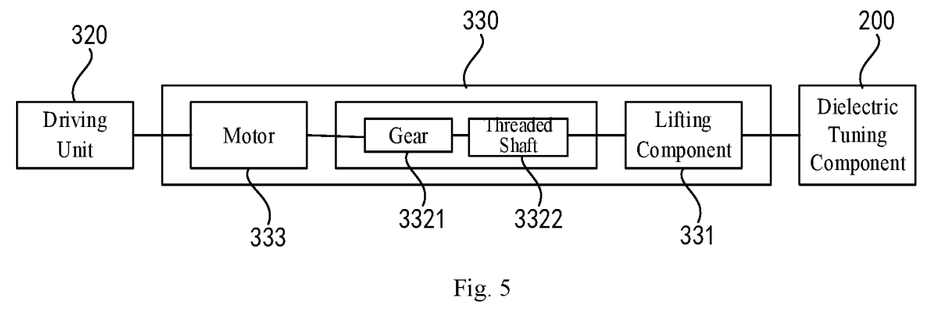
FIG. 5 is a schematic structural diagram of a duplexer provided by another embodiment of the present disclosure.

In some embodiments, as shown in FIG. 5, the transmission component 332 includes: a gear 3321, and a threaded shaft 3322.

The gear 3321 is connected with the motor 333.

The threaded shaft 3322 is connected with the gear 3321, and is in threaded connection with the lifting component 331. The threaded shaft 3322 is configured to rotate along with the gear 3321, to control the displacement of the lifting component 331.

In some embodiments, the transmission component 332 includes a gear 3321 and a threaded shaft 3322 which are connected. The motor 333 drives the gear 3321 to rotate, the gear 3321 drives the threaded shaft 3322 to rotate, and the threaded shaft 3322 drives the lifting component 331 to ascend or descend. The lifting component 331 is fixedly connected with the dielectric tuning component 200 and thus drives the dielectric tuning component 200 to be displaced, to change the relative position between the dielectric tuning component 200 and the filter 100, thereby adjusting the operating frequency of the duplexer.

It should be noted that, for the transmission component 332, if a belt pulley is adopted for transmission, there will be a problem that transmission cannot be performed at −40 degrees due to the risk of vulcanization and aging of the belt pulley, and insufficient tensile force of the belt at low temperature. The above problem can be well solved by adopting a gear for transmission in this embodiment. In addition, in this embodiment, the gear is connected with the lifting component by the threaded shaft, since the threaded shaft can accurately control the transmission stroke, the displacement accuracy of the lifting component and the calibration accuracy of a zero position can be effectively improved.

Figure 6:
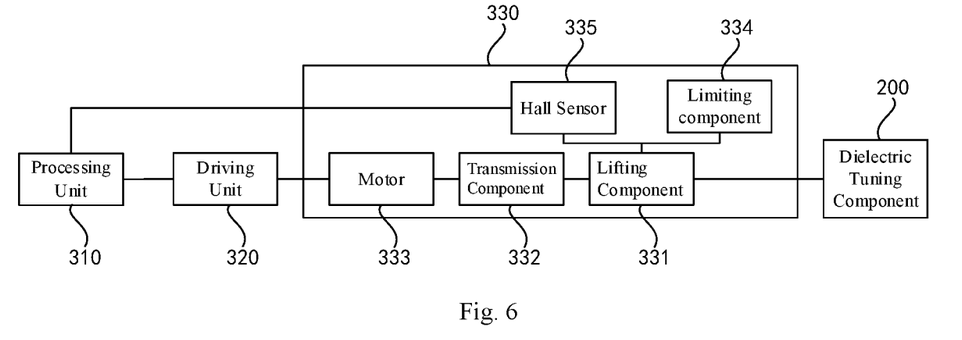
FIG. 6 is a schematic structural diagram of a duplexer provided by another embodiment of the present disclosure.

In some embodiments, as shown in FIG. 6, the motor unit 330 further includes: a limiting component 334 and a Hall sensor 335.

The limiting component 334 is configured to limit the displacement of the dielectric tuning component 200.

The Hall sensor 335 is connected with the control module 300, and configured to detect displacement data of the dielectric tuning component 200 and send the displacement data to the control module 300.

The control module 300 is further configured to determine the zero position of the dielectric tuning component 200 according to the displacement data.

In some embodiments, the motor unit 330 further includes a limiting component 334 and a Hall sensor 335. The limiting component 334 is configured to limit the displacement of the dielectric tuning component 200. It is worth noting that since the lifting component 331 is fixedly connected with the dielectric tuning component 200, the displacement data of the dielectric tuning component 200 may also be called the displacement data of the lifting component 331. The Hall sensor 335 detects the displacement data of the lifting component 331 and sends the displacement data to the processing unit 310 of the control module 300. The processing unit 310 determines the zero position of the dielectric tuning component 200 according to the displacement data of the lifting component 331. It is worth noting that since the lifting component 331 is fixedly connected with the dielectric tuning component 200, the zero position of the dielectric tuning component 200 may also be called the zero position of the lifting component 331.

In some embodiments, the Hall sensor 335 may detect the displacement data of the lifting component 331 in a way as follows: since a plurality of magnets are installed on the gear 3321, when the gear 3321 rotates, the Hall sensor 335 detects the rotation of the gear 3321 in real time, and since the relationship between the rotation of the gear 3321 and the displacement data generated by the lifting component 331 is known, the Hall sensor 335 can detect the displacement data of the lifting component 331 by detecting the rotation of the gear 3321.

In some embodiments, the Hall sensor 335 may also be replaced by other magnetic sensors.

In some embodiments, the zero position of the lifting component 331 includes a mechanical zero position and an electrical zero position. The mechanical zero position is a position where the lifting component 331 is matched with the limiting component 334. The electrical zero position and the mechanical zero position differ by a preset number of driving step values, that is, when the lifting component 331 reaches the mechanical zero position, after a driving signal with a preset number of driving step value is output to control the lifting component 331 to move a certain distance, the lifting component 331 reaches the electrical zero position. In an embodiment, after the system is powered on, sufficient driving signals are output to control the lifting component 331 to descend all the way until the lifting component 33 reaches the position where the lifting component is matched with the limiting component 334. At this time, the motor 333 can no longer rotate, and the Hall sensor 335 no longer feeds back the displacement data of the lifting component 331 to the processing unit 310, that is, the lifting component 331 reaches the mechanical zero position. If the lifting component 331 is continuously controlled to ascend for a certain distance, the lifting component 331 reaches the electrical zero position. Each subsequent adjustment of the operating frequency of the duplexer is based on the electrical zero position, that is, each time the operating frequency of the duplexer is adjusted, the lifting component 331 is first controlled to return to the electrical zero position. Since the lifting component 331 is fixedly connected with the dielectric tuning component 200, the lifting component 331 returning to the electrical zero position is equivalent to the dielectric tuning component 200 returning to the zero position. Then, the relative position between the dielectric tuning component 200 and the filter 100 is controlled to change to adjust the operating frequency of the duplexer.

It should be noted that each adjustment of the operating frequency of the duplexer is based on the return of the lifting component 331 to the electrical zero position instead of the return of the lifting component 331 to the mechanical zero position, which can avoid the wear and collision of the assemblies caused by the need for the lifting component 331 to reach the position where the lifting component 331 is matched with the limiting component 334 every time the frequency is adjusted, and prolong the service life of the component.

In this embodiment, the Hall sensor, rather than a photoelectric device (such as an infrared sensor or an optical sensor), is used in combination with the mechanical zero position and electrical zero position for detection, because the adoption of photoelectric device may lead to an inaccurate detected zero position due to light occlusion and other reasons, which in turn leads to an inaccurate adjusted operating frequency of the duplexer. Therefore, in this embodiment, using the Hall sensor in combination with mechanical zero position and electrical zero position for zero position detection can not only improve the detection accuracy, but also solve the cost problem caused by the introduction of the photoelectric device.

Figure 7:
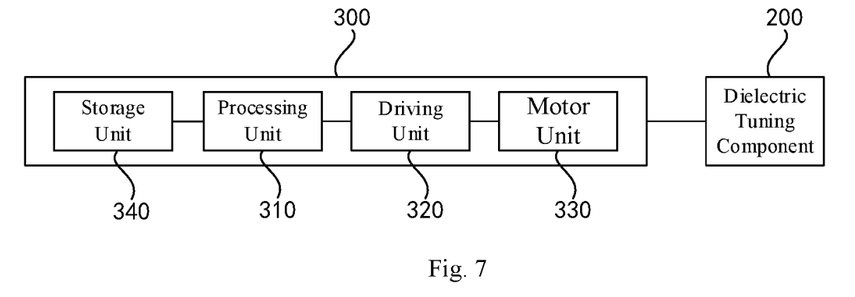
FIG. 7 is a schematic structural diagram of a duplexer provided by another embodiment of the present disclosure.

In some embodiments, as shown in FIG. 7, the control module 300 further includes a storage unit 340.

The storage unit 340 is connected with the processing unit 310 and configured to store a mapping relationship between the control signal and the driving step value.

The processing unit 310 is configured to acquire a corresponding driving step value according to the control signal, and output a driving signal according to the driving step value.

In some embodiments, the control module 300 further includes a storage unit 340 configured to store a mapping relationship between the control signal and the driving step value. The processing unit 310 receives the control signal from the CPU of the ODU, calls the mapping relationship between the control signal and the driving step value from the storage unit, acquires a corresponding driving step value according to the control signal, and outputs a driving signal according to the driving step value.

To sum up, each time the operating frequency of the duplexer is adjusted, the CPU of the ODU sends a control signal corresponding to the operating frequency of the duplexer to the processing unit 310. The processing unit 310 first controls the lifting component 331 to return to the electrical zero position, then searches a corresponding driving step value according to the control signal, outputs a corresponding driving signal according to the driving step value, and drives the lifting component 331 (or the motor 333) to move the corresponding step value. In this way, the relative position between the dielectric tuning component 200 and the filter 100 is controlled to change to adjust the operating frequency of the duplexer to a desired frequency.

In some embodiments, the filter 100 includes a housing and a dielectric tuning component 200.

The housing is internally provided with a metal diaphragm, and a chamber is formed in the middle of the housing.

The dielectric tuning component 200 is provided in the chamber.

Figure 8:
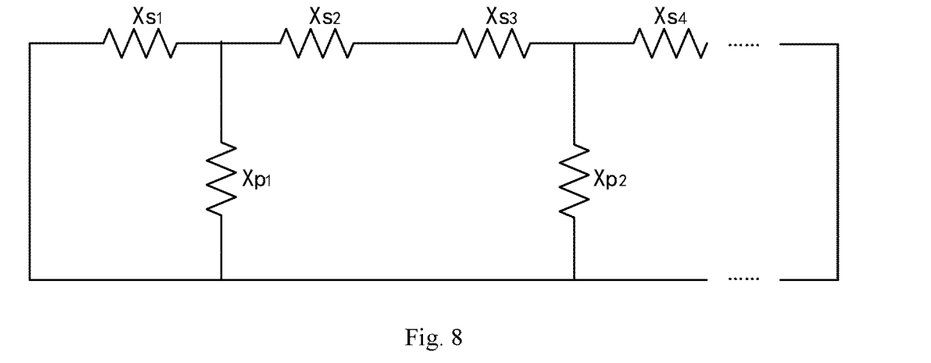
FIG. 8 is an equivalent circuit diagram of an E-plane filter provided by an embodiment of the present disclosure.

In some embodiments, the filter 100 is an E-plane filter. The E-plane filter may be considered as an alternate cascade of a metal diaphragm and an empty waveguide. The metal diaphragm may be equivalent to a T-shaped network, and the empty waveguide may be equivalent to a parallel double line. An equivalent circuit of the E-plane filter is shown in FIG. 8, where $X_{S1}$, $X_{S2}$, $X_{S3}$ and $X_{S4}$ are equivalent series reactors, and $X_{P1}$ and $X_{P2}$ are equivalent parallel reactors. Changing the position of the dielectric tuning component 200 in the chamber, that is, changing the position of the dielectric tuning component 200 in the E-plane filter relative to the metal diaphragm, can change values of the equivalent series reactors $X_{S1}$, $X_{S2}$, $X_{S3}$ and $X_{S4}$ and the equivalent parallel reactors $X_{P1}$ and $X_{P2}$, thereby changing attribute parameters of the E-plane filter, and then adjusting the operating frequency of the duplexer.

Figure 9:
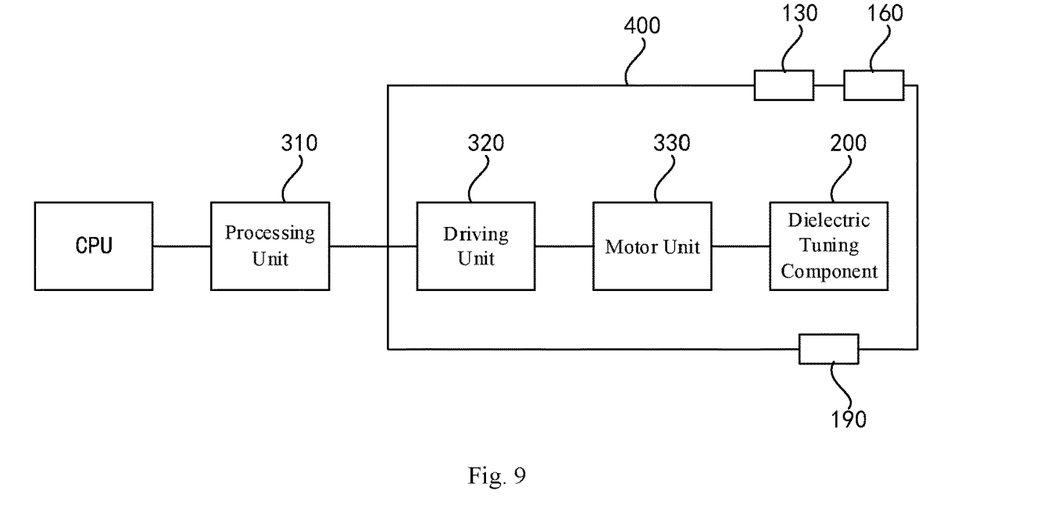
FIG. 9 is a schematic structural diagram of a duplexer provided by another embodiment of the present disclosure.

It should be noted that, in some embodiments, as shown in FIG. 9, the driving unit 320, the motor unit 330, the transmitting waveguide port 130, the receiving waveguide port 160 and the antenna waveguide port 190 are designed integrally, and a housing 400 is provided in which a metal diaphragm is embedded to form an E-plane filter.

Figure 10:
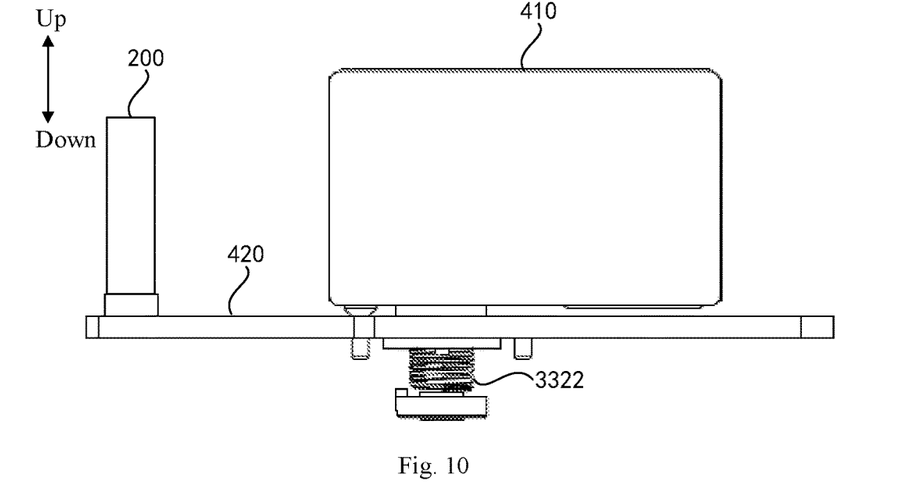
FIG. 10 is a schematic structural diagram of a duplexer provided by another embodiment of the present disclosure.
Figure 11:
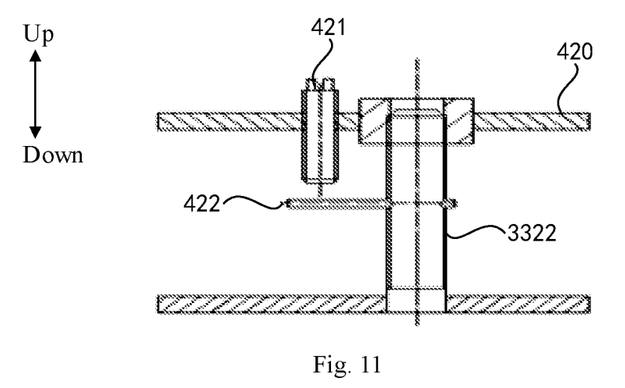
FIG. 11 is a schematic structural diagram of a duplexer provided by another embodiment of the present disclosure.

An operating principle of the duplexer of the present disclosure will be illustrated below by way of an embodiment. FIG. 10 shows the gear box 410, the threaded shaft 3322, the lifting plate 420, and the dielectric tuning component 200. The Hall sensor 335, the motor 333 and the gear 3321 are all integrated in the gear box 410. As shown in FIG. 11, a limiting post 421 is disposed on the lifting plate 420, and a limiting pin 422 is disposed on the threaded shaft 3322. It should be noted that a reverse driving signal is configured to drive the lifting component to displace reversely, which means that the lifting component displaces in a direction towards the limiting component. A forward driving signal is configured to drive the lifting component to displace forward, which means that the lifting component displaces in a direction facing away from the limiting component.

1) When the duplexer is turned on, the control module outputs sufficient reverse driving signals, and the motor 333 rotates forward to drive the threaded shaft 3322 to rotate clockwise, so as to control the lifting plate 420 to descend (i.e., displace reversely) until the limiting post 421 on the lifting plate 420 is in contact with the limiting pin 422 (FIG. 11 is a schematic structural diagram showing the limiting post 421 being in contact with the limiting pin 422), and the position of contact is the mechanical zero position.

2) After the mechanical zero position is reached, the motor 333 can no longer rotate, and the Hall sensor 335 no longer feeds back signals. It may be set that if the feedback signals of the Hall sensor 335 are not received within N consecutive reverse driving signals, it is determined the mechanical zero position has been reached.

3) The control module continuously outputs sufficient forward driving signals, and the motor 333 rotates reversely to drive the threaded shaft 3322 to rotate counterclockwise.

It may be set that a fixed number of forward driving signals are output to control the lifting plate 420 to ascend (i.e., displace forward) for a certain safe distance to reach the electrical zero position.

4) After the electrical zero position is confirmed, each time the operating frequency of the duplexer is adjusted, the relative position between the dielectric tuning component 200 and the E-plane filter can be accurately adjusted based on the electrical zero position, so as to achieve the purpose of adjusting the operating frequency of the duplexer.

Figure 12:
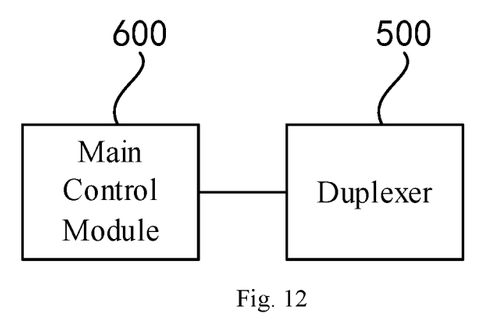
FIG. 12 is a schematic structural diagram of a network device provided by an embodiment of the present disclosure.

In accordance with another aspect of the present disclosure, as shown in FIG. 12, an embodiment provides a network device. The network device includes: the duplexer 500 described in the above aspect; and a main control module 600.

The main control module 600 is connected with the duplexer 500 and configured to send a control signal to the duplexer 500 to adjust an operating frequency of the duplexer 500.

In some embodiments, the main control module 600 is the CPU of the ODU described above. The duplexer 500 is communicatively connected with the CPU, and receives the control signal sent by the CPU. The operating frequency of the duplexer 500 is adjusted according to the control signal. For the specific adjustment process, please refer to the description in the embodiments described above, which will not be repeated here.

Figure 13:
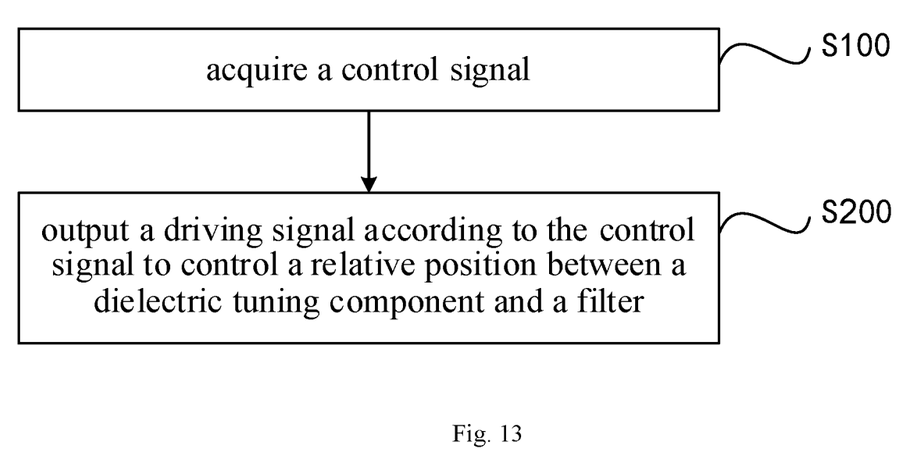
FIG. 13 is a flowchart of a duplexer control method provided by an embodiment of the present disclosure.

In accordance with another aspect of the present disclosure, an embodiment provides a duplexer control method, which is applied to the duplexer described above. In some embodiments, as shown in FIG. 13, the method includes following steps of S100 to S200.

At S100, a control signal is acquired.

At S200, a driving signal is output according to the control signal to control a relative position between a dielectric tuning component and a filter.

In some embodiments, the relative position between the dielectric tuning component and the filter (an internal metal diaphragm) of the duplexer is one of the important factors that determine the electrical performance (e.g., operating frequency) of the duplexer. The duplexer acquires the control signal, and outputs the driving signal according to the control signal to control the relative position between the dielectric tuning component and the filter, so as to achieve the purpose of adjusting the operating frequency of the duplexer, thereby improving the flexibility and application range of the duplexer, and reducing the stock pressure of the manufacturer.

Figure 14:
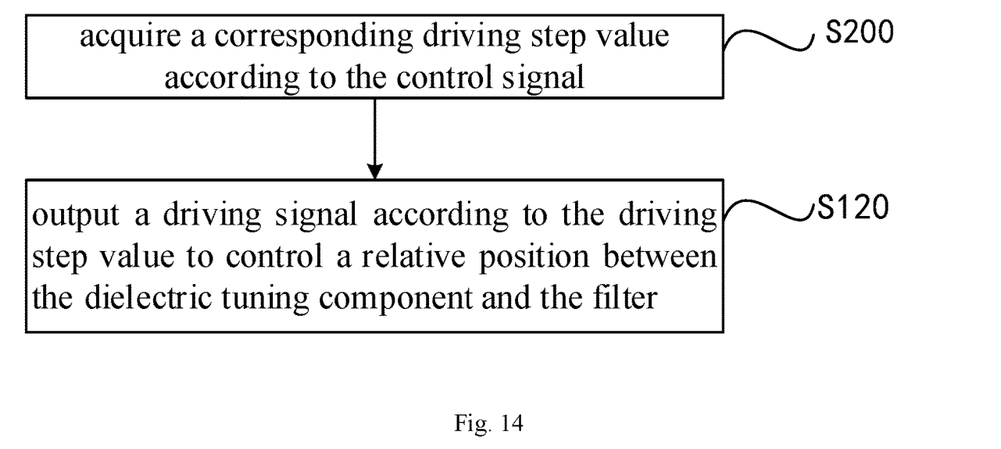
FIG. 14 is a flowchart of a duplexer control method provided by another embodiment of the present disclosure.

In some embodiments, as shown in FIG. 14, S200 includes following steps of S210 to S220.

At S210, a corresponding driving step value is acquired according to the control signal.

At S220, a driving signal is output according to the driving step value to control a relative position between the dielectric tuning component and the filter.

In some embodiments, the duplexer receives the control signal from the CPU of the ODU, calls the mapping relationship between the control signal and the driving step value from the storage unit, acquires a corresponding driving step value according to the control signal, and outputs a driving signal according to the driving step value.

Figure 15:
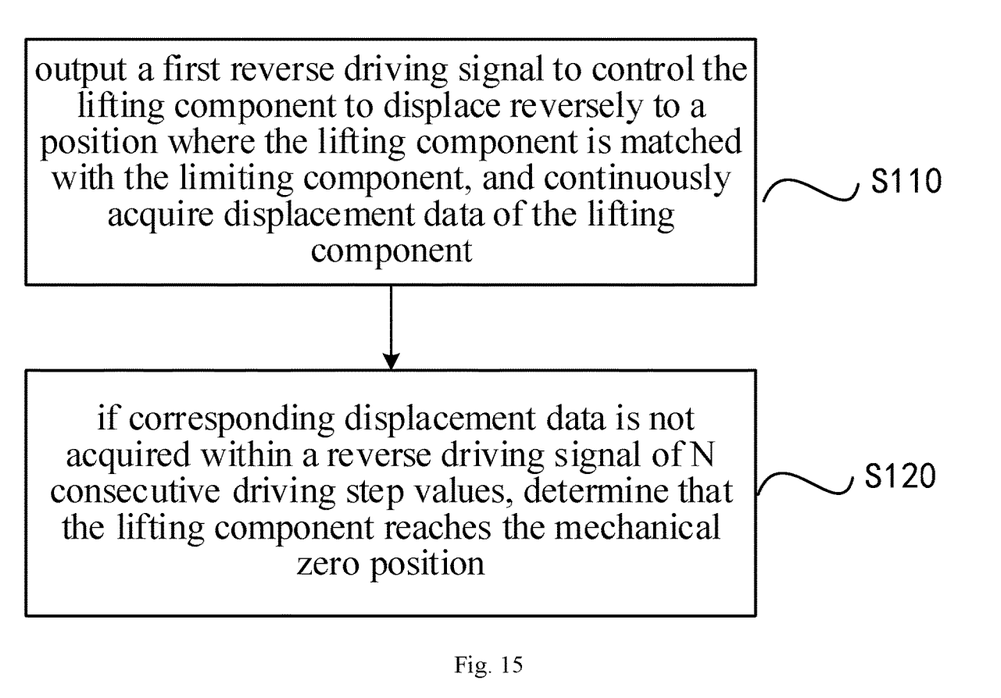
FIG. 15 is a flowchart of a duplexer control method provided by another embodiment of the present disclosure.

In some embodiments, as shown in FIG. 15, prior to S100, the method further includes following steps of S110 to S120.

At S110, a first reverse driving signal is output to control the lifting component to displace reversely to a position where the lifting component is matched with the limiting component, and displacement data of the lifting component is continuously acquired.

At S120, if corresponding displacement data is not acquired within a reverse driving signal of N consecutive driving step values, it is determined that the lifting component reaches the mechanical zero position, where N is a first preset value.

In some embodiments, before adjusting the operating frequency of the duplexer, it is necessary to detect and calibrate the zero position of the duplexer. In an embodiment, the duplexer first outputs a first reverse driving signal to control the lifting component to displace reversely to the position where the lifting component is matched with the limiting component, and continuously acquires displacement data of the lifting component, so as to detect whether the lifting component reaches the mechanical zero position. If corresponding displacement data is not acquired within a second reverse driving signal of N consecutive driving step values, it is indicated that the lifting component has reached the position where the lifting component is matched with the limiting component. At this time, the motor can no longer rotate and thus cannot drive the lifting component to continuously displace. Therefore, if corresponding displacement data is not acquired within the reverse driving signal of N consecutive driving step values, it is determined that the lifting component reaches the mechanical zero position, where N is a first preset value. During practice, the displacement data may be missed due to electrical transmission and other reasons, if it is immediately determined that the lifting component reaches the mechanical zero position when it is detected that the displacement data is not acquired, a misjudgment may occur. In this embodiment, by means of a judgment mechanism that the lifting component is determined to reach the mechanical zero position only when the corresponding displacement data is not acquired within the second reverse driving signal of N consecutive driving step values, the probability of misjudgment is reduced, and the detection accuracy of the mechanical zero position are effectively improved.

In some embodiments, experiments show that it is better to set N to 10, which can not only improve the detection accuracy of the mechanical zero position, but also avoid an overlong detection time.

Figure 16:
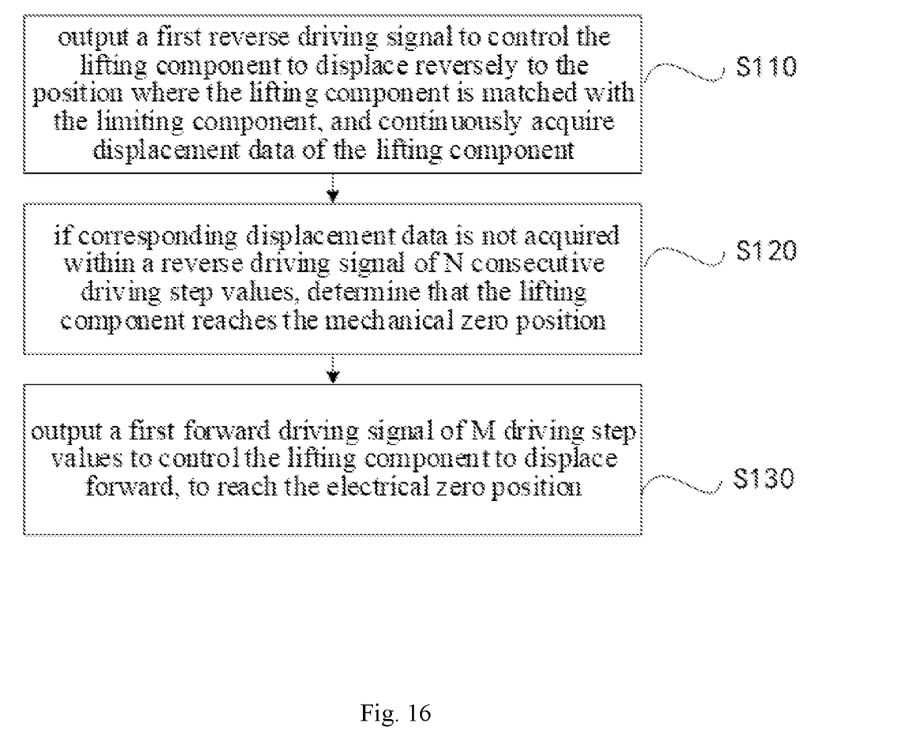
FIG. 16 is a flowchart of a duplexer control method provided by another embodiment of the present disclosure.

In some embodiments, as shown in FIG. 16, after S120, the method further includes a following step of S130.

At S130, a first forward driving signal of M driving step values is output to control the lifting component to displace forward, to reach the electrical zero position, where M is a second preset value.

In some embodiments, after it is determined that the lifting component has reached the mechanical zero position, the duplexer continuously outputs a first forward driving signal of M driving step values to control the lifting component to displace forward, to reach the electrical zero position, where M is a second preset value and has been preset in the system. Each subsequent adjustment of the operating frequency of the duplexer is based on the return of the lifting component to the electrical zero position.

It should be noted that each adjustment of the operating frequency of the duplexer is based on the return of the lifting component to the electrical zero position instead of the return of the lifting component to the mechanical zero position, which can avoid the wear and collision of the assemblies caused by the need for the lifting component to reach the position where the lifting component is matched with the limiting component every time the frequency is adjusted, and prolong the service life of the component.

In this embodiment, a Hall sensor, rather than a photoelectric device (such as an infrared sensor or an optical sensor), is used in combination with the mechanical zero position and electrical zero position for detection, because the adoption of photoelectric device may lead to an inaccurate detected zero position due to light occlusion and other reasons, which in turn leads to an inaccurate adjusted operating frequency of the duplexer. Therefore, in this embodiment, using Hall sensor in combination with mechanical zero position and electrical zero position for zero position detection can not only improve the detection accuracy, but also solve the cost problem caused by the introduction of the photoelectric device.

Figure 17:
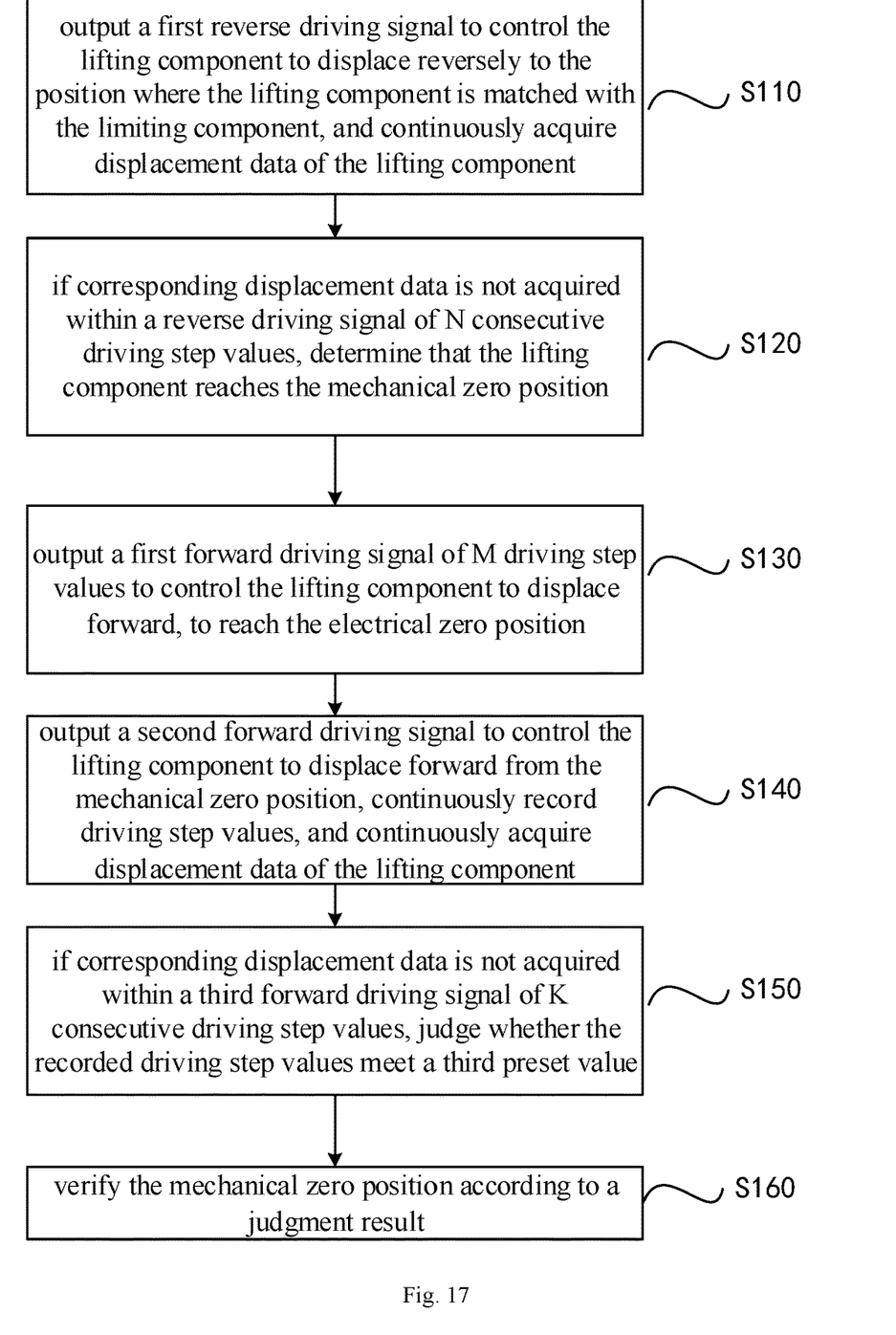
FIG. 17 is a flowchart of a duplexer control method provided by another embodiment of the present disclosure.

In some embodiments, as shown in FIG. 17, after S120, the method further includes S140 to S160.

At S140, a second forward driving signal is output to control the lifting component to displace forward from the mechanical zero position, driving step values are continuously recorded, and displacement data of the lifting component is continuously acquired.

At S150, if corresponding displacement data is not acquired within a third forward driving signal of K consecutive driving step values, it is judged whether the recorded driving step values meet a third preset value.

At S160, the mechanical zero position is verified according to a judgment result.

In some embodiments, it is necessary to verify whether the mechanical zero position (or electrical zero position) is correct after controlling the lifting component to reach the electrical zero position. In an embodiment, after controlling the lifting component to reach the electrical zero position, the duplexer continuously outputs a second forward driving signal to control the lifting component to displace forward from the mechanical zero position, continuously records driving step values, and continuously acquires displacement data of the lifting component. If corresponding displacement data is not acquired within a third forward driving signal of K consecutive driving step values, it is indicated that the lifting component has already displaced to a position where it cannot displace (for example, the gear box in FIG. 10), and it cannot displace any more. At this time, it is judged whether the recorded driving step values meet a third preset value. If the recorded driving step values meet the third preset value, the mechanical zero position is accurate. It can be understood that for operators or manufacturers, the distance from the mechanical zero position to the position where the lifting component cannot displace is fixed, so is the number of driving step values required to drive the lifting component from the mechanical zero position to the position where the lifting component cannot displace.

For example, 4200 driving step values are required to drive the lifting component from the mechanical zero position to the position where the lifting component cannot displace, and 20 driving step values are required between the mechanical zero position and the electrical zero position. First, a first reverse driving signal is output to control the lifting component to displace reversely to a position where the lifting component is matched with the limiting component. At this time, the motor cannot rotate, and the Hall sensor no longer feeds back displacement data of the lifting component, so it is preliminarily determined that the lifting component has reached the mechanical zero position. Then, a second reverse driving signal of 10 driving step values (i.e., N=10) is continuously output, if the displacement data of the lifting component is not continuously acquired within the second reverse driving signal of these 10 driving step values, it is determined that the lifting component has reached the mechanical zero position. Then, a first forward driving signal of 20 (i.e., M=20) driving step values is continuously output to drive the lifting component to displace forward to the electrical zero position. At this time, the recorded driving step values are 20. Then, a second forward driving signal is continuously output to drive the lifting component to continuously displace forward. When the lifting component continuously displaces forward to a position where it cannot displace, the lifting component cannot displace any more. A forward driving signal of 10 (i.e., K=10) driving step values is continuously output, and if the displacement data of the lifting component is not continuously acquired within the third forward driving signal of the 10 driving stepping values, it is judged whether the recorded driving stepping values meet a third preset value. If the recorded driving step values are 4210 at this time, which just meet the third preset value (the third preset value is 4210 theoretically because the driving step values required to drive the lifting component from the mechanical zero position to the position where the lifting component cannot displace are 4200, and then 10 more driving step values are output), it is verified that the electrical zero position of the lifting component is accurate. If the electrical zero position of the lifting component is inaccurate, the above steps are re-executed to re-verify whether the electrical zero position of the lifting component is accurate.

It should be noted that each adjustment of the operating frequency of the duplexer is based on the return of the lifting component to the electrical zero position, other than the position of the lifting component after a previous adjustment of the operating frequency, because if the position of the lifting component already has errors after the previous adjustment of the operating frequency, the subsequent frequency adjustment will make the errors continue to be superimposed, and the adjusted frequency will become more and more inaccurate. Therefore, in this embodiment, each adjustment of the operating frequency of the duplexer is based on the return of the lifting component to the electrical zero position, so it is particularly important to calibrate and verify the electrical zero position, which can effectively avoid the influence of previous errors on a current frequency adjustment, and improve the accuracy of frequency adjustment.

Figure 18:
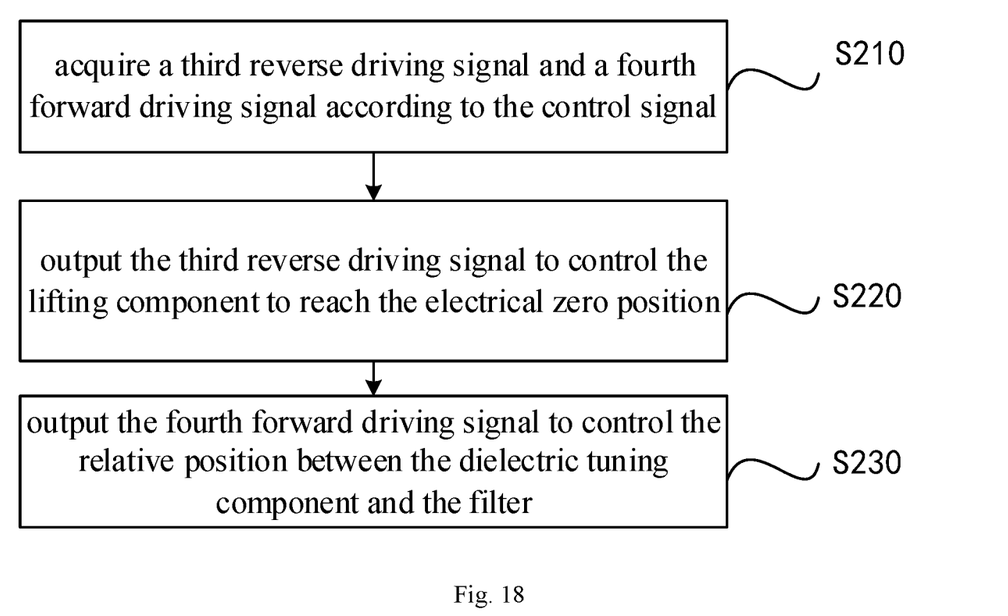
FIG. 18 is a flowchart of a duplexer control method provided by another embodiment of the present disclosure.

In some embodiments, as shown in FIG. 18, S200 includes S210 and S230.

At S210, a third reverse driving signal and a fourth forward driving signal are acquired according to the control signal.

At S220, the third reverse driving signal is output to control the lifting component to reach the electrical zero position.

At S230, the fourth forward driving signal is output to control the relative position between the dielectric tuning component and the filter.

In some embodiments, assuming that the lifting component is currently at the electrical zero position, the lifting component does not need to return to the electrical zero position, and the duplexer directly acquires a corresponding driving step value according to the control signal, and outputs the fourth forward driving signal according to the driving step value to control the relative position between the dielectric tuning component and the filter.

In some embodiments, assuming that the lifting component is currently not at the electrical zero position, the lifting component needs to return to the electrical zero position before the frequency is adjusted. If the operating frequency of the duplexer is adjusted to a preset frequency F1 previously, and the driving step values corresponding to the driving signal output by the duplexer are X, when the operating frequency of the duplexer is adjusted this time, it is necessary to first output a reverse driving signal of X driving step values (that is, the third reverse driving signal) to control the lifting component to return to the electrical zero position. In some embodiments, the number X of the driving step values output at a previous time needs to be stored in the storage unit, and the duplexer needs to acquire X from the storage unit, and then outputs a reverse driving signal of X driving step values according to X. After the lifting component is controlled to return to the electrical zero position, the control signal sent by the CPU of the ODU is received, where the control signal indicates to which frequency the operating frequency of the duplexer needs to be adjusted this time. The mapping relationship between the control signal and the driving step value is called from the storage unit, and a corresponding driving step value is acquired according to the control signal. Then, the fourth forward driving signal is output according to the driving step value, to control the relative position between the dielectric tuning component and the filter, so as to adjust the operating frequency of the duplexer.

Figure 19:
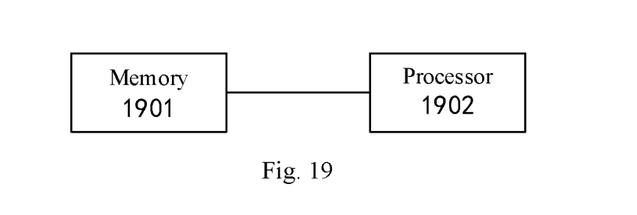
FIG. 19 is a schematic diagram of an electronic device provided by an embodiment of the present disclosure.

In accordance with another aspect of the present disclosure, referring to FIG. 19, an embodiment provides an electronic device. The device includes a memory 1901, a processor 1902, and a computer program stored in the memory 1901 and executable by the processor 1902 which, when executed by the processor 1902, causes the processor 1902 to implement:

the steps of the duplexer control method described above.

In accordance with another aspect of the present disclosure, an embodiment provides a storage medium configured for computer-readable storage, where the storage medium stores at least one program which, when executed by at least one processor, causes the at least one processor to implement:

the steps of the duplexer control method described above.

According to the duplexer, network device, control method, electronic device and storage medium provided by the embodiments of the present disclosure, by controlling a relative position between a dielectric tuning component and a filter, and changing reactance parameters of an equivalent circuit of the filter so as to change the attribute parameters of the filter, the purpose of adjusting the operating frequency of the duplexer is achieved. When a duplexer with multiple frequencies is needed, the operating frequency of the duplexer can be adjusted by adjusting the relative position between the dielectric tuning component and the filter, which improves the flexibility and application range of the duplexer, thereby avoiding the problem that a certain stock of duplexer spare parts needs to be prepared for different sub-bands, and reducing the stock pressure of the manufacturer.

As will be understood by those having ordinary skills in the art that all or some of the steps, systems and functional modules/units in the devices disclosed above may be implemented as software, firmware, hardware and appropriate combinations thereof.

In the hardware implementation, the division between functional modules/units mentioned in the above description does not necessarily correspond to the division of physical components. For example, a physical component may have multiple functions, or a function or step may be cooperatively performed by multiple physical components. Some or all of the physical components may be implemented as software executed by a processor, such as a central processing unit, a digital signal processor or a microprocessor, or as hardware, or as an integrated circuit, such as an application specific integrated circuit. Such software may be distributed on a computer-readable medium, and the computer-readable medium may include a computer storage medium (or a non-transitory medium) and a communication medium (or a transitory medium). As is well known to those having ordinary skills in the art, the term computer storage medium includes volatile and nonvolatile, removable and non-removable media implemented in any method or technology for storing information such as computer readable instructions, data structures, program modules or other data. A computer storage medium may include RAM, ROM, EEPROM, flash memory or other memory technologies, CD-ROM, digital versatile disk (DVD) or other optical disk storage, magnetic cassette, magnetic tape, magnetic disk storage or other magnetic storage devices, or any other media that can be used to store desired information and can be accessed by a computer. In addition, it is well known to those having ordinary skills in the art that the communication medium may generally include computer readable instructions, data structures, program modules or other data in a modulated data signal such as a carrier wave or other transmission mechanism, and may include any information delivery medium.

Some embodiments of the present disclosure are described above with reference to the drawings, and are not intended to limit the scope of protection of the present disclosure. Any modification, equivalent replacement, and improvement made by those having ordinary skills in the art without departing from the scope of the present disclosure shall be contained within the scope of protection of the present disclosure.

What is claimed is:

1. A duplexer, comprising:
    a filter;
    a dielectric tuning component;
    a control module connected with the dielectric tuning component and configured to control a relative position between the dielectric tuning component and the filter to adjust an operating frequency of the duplexer;
    a limiting component configured to limit the displacement of the dielectric tuning component; and
    a Hall sensor connected with the control module, and configured to detect displacement data of the dielectric tuning component and send the displacement data to the control module;
    wherein the control module is further configured to determine a zero position of the dielectric tuning component according to the displacement data;
    wherein the zero position comprises a mechanical zero position and an electrical zero position, the mechanical zero position is a position where the dielectric tuning component is matched with the limiting component, the electrical zero point is at a distance of M driving step values from the mechanical zero point, where M is a second preset value, the electrical zero point is used to return the dielectric tuning component to the electrical zero point when adjusting the operating frequency of the duplexer, and the adjusting is based on the electrical zero point.

2. The duplexer of claim 1, wherein the control module comprises:

a processing unit configured to acquire a control signal and output a driving signal according to the control signal;

a driving unit connected with the processing unit and configured to receive the driving signal and drive a motor unit according to the driving signal; and the motor unit connected with the driving unit and the dielectric tuning component respectively, and configured to control the relative position between the dielectric tuning component and the filter.

3. The duplexer of claim 2, wherein the motor unit comprises:

a lifting component connected with the dielectric tuning component;

a transmission component connected with the lifting component and configured to control the displacement of the lifting component, so as to control the relative position between the dielectric tuning component and the filter; and a motor connected with the driving unit and the transmission component respectively, and configured to drive the transmission component.

4. The duplexer of claim 3, wherein the transmission component comprises:

a gear connected with the motor; and a threaded shaft connected with the gear, wherein the threaded shaft is in threaded connection with the lifting component and is configured to rotate along with the gear to control the displacement of the lifting component.

5. The duplexer of claim 2, wherein the control module further comprises:

a storage unit connected with the processing unit and configured to store a mapping relationship between the control signal and a driving step value;

wherein the processing unit is configured to acquire a corresponding driving step value according to the control signal and output the driving signal according to the driving step value.

6. A network device, comprising:

a duplexer comprising:

a filter;

a dielectric tuning component; and a control module connected with the dielectric tuning component and configured to control a relative position between the dielectric tuning component and the filter to adjust an operating frequency of the duplexer;

a limiting component configured to limit the displacement of the dielectric tuning component;

a Hall sensor connected with the control module, and configured to detect displacement data of the dielectric tuning component and send the displacement data to the control module;

wherein the control module is further configured to determine a zero position of the dielectric tuning component according to the displacement data;

wherein the zero position comprises a mechanical zero position and an electrical zero position, the mechanical zero position is a position where the dielectric tuning component is matched with the limiting component, the electrical zero point is at a distance of M driving step values from the mechanical zero point, where M is a second preset value, the electrical zero point is used to return the dielectric tuning component to the electrical zero point when adjusting the operating frequency of the duplexer, and the adjusting is based on the electrical zero point; and a main control module connected with the duplexer, and configured to send a control signal to the duplexer to adjust the operating frequency of the duplexer.

7. A duplexer control method, wherein the duplexer comprises a filter, a dielectric tuning component, a Hall sensor, a lifting component and a limiting component, the lifting component is connected with the dielectric tuning component, and the limiting component is configured to limit the displacement of the lifting component, the method comprising:

acquiring a control signal; and outputting a driving signal according to the control signal to control a relative position between the dielectric tuning component and the filter to adjust the operating frequency of the duplexer;

prior to acquiring a control signal, the method further comprises:

outputting a first reverse driving signal to control the lifting component to displace reversely to a position where the lifting component is matched with the limiting component, and continuously acquiring displacement data of the lifting component through the Hall sensor; and in response to corresponding displacement data being not acquired within a second reverse driving signal of N consecutive driving step values, determining that the lifting component reaches a mechanical zero position, where N is a first preset value;

wherein after determining that the lifting component reaches a mechanical zero position, the method further comprises:

outputting a first forward driving signal of M driving step values to control the lifting component to displace forward, to reach an electrical zero position, where M is a second preset value, the electrical zero point is used to return the dielectric tuning component to the electrical zero point when adjusting the operating frequency of the duplexer, and the adjusting is based on the electrical zero point.

8. The duplexer control method of claim 7, wherein outputting a driving signal according to the control signal to control a relative position between the dielectric tuning component and the filter to adjust the operating frequency of the duplexer comprises:

acquiring a corresponding driving step value according to the control signal; and outputting the driving signal according to the driving step value to control the relative position between the dielectric tuning component and the filter.

9. The duplexer control method of claim 7, wherein after determining that the lifting component reaches a mechanical zero position, the method further comprises:

outputting a second forward driving signal to control the lifting component to displace forward from the mechanical zero position, continuously recording driving step values, and continuously acquiring displacement data of the lifting component;

in response to corresponding displacement data being not acquired within a third forward driving signal of K consecutive driving step values, judging whether the recorded driving step values meet a third preset value; and verifying the mechanical zero position according to a judgment result.

10. The duplexer control method of claim 7, wherein outputting a driving signal according to the control signal to control a relative position between the dielectric tuning component and the filter comprises:
- acquiring a third reverse driving signal and a fourth forward driving signal according to the control signal;
- outputting the third reverse driving signal to control the lifting component to reach the electrical zero position; and
- outputting the fourth forward driving signal to control the relative position between the dielectric tuning component and the filter.

11. An electronic device, comprising:
- a memory, a processor, and a computer program stored in the memory and executable by the processor which, when executed by the processor, causes the processor to perform a duplexer control method, wherein the duplexer comprises a filter, a dielectric tuning component, a Hall sensor, a lifting component and a limiting component, the lifting component is connected with the dielectric tuning component, and the limiting component is configured to limit the displacement of the lifting component, the method comprising:
- acquiring a control signal; and
- outputting a driving signal according to the control signal to control a relative position between the dielectric tuning component and the filter to adjust the operating frequency of the duplexer;

prior to acquiring a control signal, the method further comprises:
- outputting a first reverse driving signal to control the lifting component to displace reversely to a position where the lifting component is matched with the limiting component, and continuously acquiring displacement data of the lifting component through the Hall sensor; and
- in response to corresponding displacement data being not acquired within a second reverse driving signal of N consecutive driving step values, determining that the lifting component reaches a mechanical zero position, where N is a first preset value;

wherein after determining that the lifting component reaches a mechanical zero position, the method further comprises:
- outputting a first forward driving signal of M driving step values to control the lifting component to displace forward, to reach an electrical zero position, where M is a second preset value, the electrical zero point is used to return the dielectric tuning component to the electrical zero point when adjusting the operating frequency of the duplexer, and the adjusting is based on the electrical zero point.

* * * * *